United States Patent [19]

Hunsinger

[11] 4,017,804
[45] Apr. 12, 1977

[54] BROAD BAND VARIABLE GAIN AMPLIFIER

[75] Inventor: Dan M. Hunsinger, San Jose, Calif.

[73] Assignee: Hewlett-Packard Company, Palo Alto, Calif.

[22] Filed: Dec. 5, 1975

[21] Appl. No.: 637,910

[52] U.S. Cl. .................................. 330/29; 330/30 D
[51] Int. Cl.² ...................... H03G 3/30; H03F 3/45
[58] Field of Search ...................... 330/29, 30 D, 69

[56] References Cited
UNITED STATES PATENTS 3,891,937 6/1975 Bockelmann ..................... 330/29

Primary Examiner—James B. Mullins
Attorney, Agent, or Firm—Allston L. Jones

[57] ABSTRACT

A broad band variable gain amplifier circuit for use as an automatic gain control amplifier with a differentially connected transistor pair as the basic amplifier element is described. Additional transistor circuits are provided so that the amplifier gain becomes a function of a simple ratio of a pair of D.C. bias currents that are applied to these transistor circuits. The gain function being proportional to a simple ratio of two bias currents provides the ability to simply vary the amplifier gain either hyperbolically or linearly. Also, the noise component and the variations of the D.C. component of the output are minimized by subtracting a D.C. current that is the D.C. component of the input current at the minimum amplifier gain less a D.C. current that is a function of the amplifier gain from the externally applied input current.

8 Claims, 5 Drawing Figures (a) PRIOR ART  (b)

BROAD BAND VARIABLE GAIN AMPLIFIER

BACKGROUND OF THE INVENTION

This invention is concerned generally with broad band amplifiers, and, more particularly, with automatic gain control (AGC) amplifiers.

A broad band, variable gain, AGC amplifier typically comprises a differentially connected pair of matched transistors as a basic circuit around which the various circuit configurations of the prior art are constructed. The input signal to the differentially connected pair is the sum of the emitter currents of the two transistors and the output signal is the collector current of one of the two transistors. Typically, the inverse of the amplifier current gain is an exponential function of the differential base bias voltage of the differentially connected transistor pair plus unity. Various methods of controlling the differential base bias voltage have been used in the prior art, but none of these techniques provides the ability to vary the amplifier gain hyperbolically as a function of a D.C. control signal. Also, the differentially connected transistor pair without compensation typically has a temperature-dependent gain which is an exponential function of a selected control signal.

In most applications, the output signal of the AGC amplifier is to be kept constant for all levels of the input signal. The basic differentially connected transistor pair suffers from two major disadvantages in these applications. The first disadvantage is that the modulation index of the output signal is equal to the modulation index of the input signal and both vary widely. The modulation index is defined as a ratio of the A.C. signal current to the D.C. bias current. The variation in the output modulation index has not been solved — only tolerated — by the prior art. In a paper by Barrie Gilbert entitled "A New Wide-Band Amplifier Technique", IEEE Journal of Solid State Circuits, Vol. SC-3, No. 4, pp. 353-365, December 1968, a four-quadrant multiplier was introduced which eliminates the variation of both the input and output D.C. bias currents but not the variation of the modulation indices. In addition, this realization is considerably noisier than the basic differentially connected transistor pair.

The second disadvantage is that the r.m.s. noise component of the output current is proportional to the D.C. component of the input current, assuming that the dominant noise source is the base resistance of the transistors in the differentially connected pair. In the paper by W. M. C. Sansen and R. G. Meyer, entitled "An Integrated Wide-Band Variable-Gain Amplifier with Maximum Dynamic Range", IEEE Journal of Solid-State Circuits, Vol. SC-9, No. 4, pp. 159–166, August 1974, a constant current is subtracted from the input D.C. bias current by connecting a resistor between the positive voltage source and the differentially connected emitters of the transistor pair, forcing the differentially connected pair amplifier to operate at a lower D.C. bias current. This solution, however, does not optimize the noise performance over the range of circuit gains and is only of value when the modulation index of the input signal is sufficiently small, which is not always the case.

SUMMARY OF THE INVENTION

The preferred embodiment of the present invention provides a broad band variable gain amplifier with a means of varying the gain hyperbolically or linearly by varying a single selected D.C. bias current in relation to another D.C. bias current. Also, a means for minimizing the noise component of the output current and the variation of the D.C. component of the output current with changes in the D.C. component of the input current is provided. This second feature is of particular value when the amplifier is to be used in an automatic gain control situation where the output signal is to be kept constant for all levels of the input signal.

In accordance with the illustrated embodiment, the present invention provides a broad band variable gain amplifier including a differentially connected transistor pair, a means of varying the gain of the transistor pair as a simple ratio of two externally applied variable D.C. bias currents, and a means of varying the input current to the transistor pair as a function of the gain of the amplifier. The means for varying the gain of the differentially connected pair is implemented by making one of a pair of control currents proportional to a first of the selected D.C. bias currents, and the other of the pair of control currents proportional to a second of the selected D.C. bias currents less a current that is equivalent to the first selected D.C. bias current, yielding an amplifier gain function that is equivalent to a simple ratio of the two selected D.C. bias currents. The input current varying means is implemented by subtracting a variable D.C. current that is the D.C. component of the input current at the minimum amplifier gain less a D.C. current that is a function of the amplifier gain from the externally applied input current of the amplifier.

DESCRIPTION OF THE PREFERRED EMBODIMENT

Figure 1:
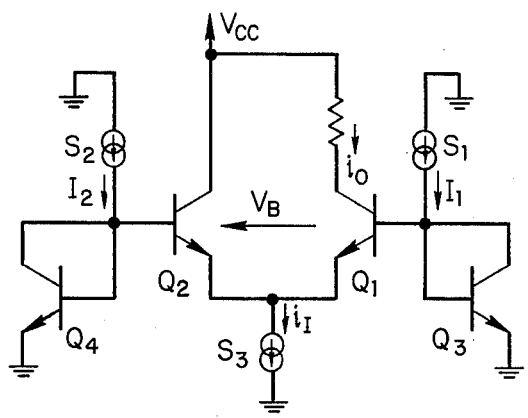
FIG. 1 is a schematic diagram of a typical broad band variable gain amplifier of the prior art.

FIG. 1 shows transistors $Q_1$ and $Q_2$ interconnected as a typical differentially connected pair. Transistors $Q_3$ and $Q_4$, each having its base connected to its collector and to the base of transistors $Q_1$ and $Q_2$, respectively, function as diodes to provide the base control voltage $V_B$ between the bases of transistors $Q_1$ and $Q_2$ by means of gain control D.C. currents $I_1$ and $I_2$ from D.C. current sources $S_1$ and $S_2$ respectively.

The collector current, $i_o$ of $Q_1$ is the output signal of the circuit and the differentially connected pair emitter current, $i_I$ into current sink $S_3$, is the input signal of the circuit. The well-known current gain function for this circuit is $$\frac{i_o}{i_I} = A_I = \frac{1}{1 + \exp\left(\frac{qV_B}{kT}\right)}, \text{ for } 0 \leq A_I \leq 1, \quad (1)$$

where $q$ is the charge of a single electron, $k$ is Bolzmann's constant, and $T$ is the absolute temperature. From the circuit configuration of FIG. 1, where diode connected transistors $Q_3$ and $Q_4$ provide temperature compensation, it can be shown that $$V_B = \frac{kT}{q} \ln \frac{I_2}{I_1} \quad (2)$$

Thus, the current gain expression for the circuit shown in FIG. 1 becomes independent of temperature and simplifies to $$\frac{i_o}{i_I} = A_I = \frac{1}{1 + \frac{I_2}{I_1}}, \text{ for } 0 \leq A_I \leq 1. \quad (3)$$

$A_I$ for the prior art circuit shown in FIG. 1 includes a unity offset in the denominator of that expression. Thus, the gain of that circuit cannot be varied hyperbolically as a function of one of the gain control D.C. current $I_1$ or $I_2$.

Figure 2:
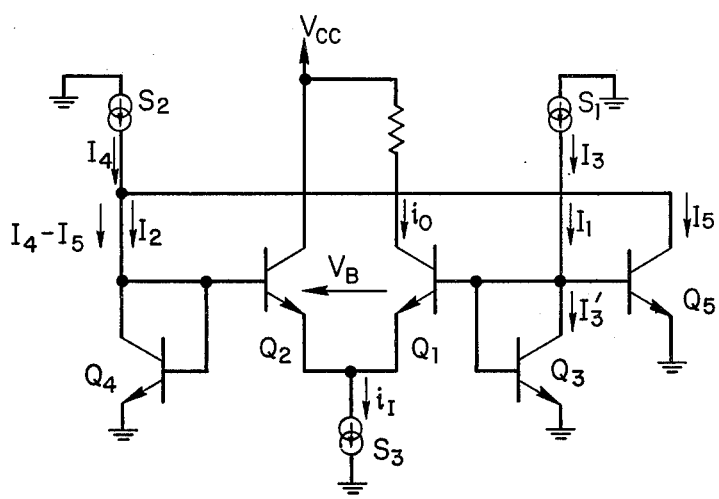
FIG. 2 is a schematic diagram of one embodiment of the present invention.

The circuit shown in FIG. 2 is the circuit of FIG. 1 with the addition of a transistor $Q_5$. Transistor $Q_5$ is interconnected to the other circuit components by grounding its emitter, connecting its base to the base of transistor $Q_3$, and its collector to the collector of transistor $Q_4$. The connection of the collectors of transistors $Q_4$ and $Q_5$ results in the transistor $Q_5$ collector current, $I_5$, being subtracted from the D.C. bias current $I_4$ from D.C. current source $S_2$. Also, by matching transistors $Q_3$ and $Q_5$, current $I_5$ will be substantially equal to the D.C. bias current $I_3$ from D.C. current source $S_1$ since the base to emitter voltage of both of these matched transistors is the same.

For the circuit shown in FIG. 2, the current gain is $$A_I = \frac{1}{1 + \frac{I_2}{I_1}}, \quad (4)$$

where $I_1$ and $I_2$ are the D.C. collector currents of transistors $Q_3$ and $Q_4$, respectively, as in the circuit of FIG. 1.

For the situation where $I_3 \approx I_5$, $I_1 = I_3$ and $I_2 = I_4 - I_3$ for $I_4 \geq I_3$ and the current gain is $$A_I = \frac{I_3}{I_4} \quad (5)$$

Thus, the current gain, $A_I$, as a simple ratio of two currents, provides the capability of simply varying the current gain, $A_I$, hyperbolically by holding gain control D.C. current $I_3$ constant while gain control D.C. current $I_4$ is varied. The current gain can also be varied linearly by holding gain control D.C. current $I_4$ constant while varying gain control D.C. current $I_3$.

Figure 3:
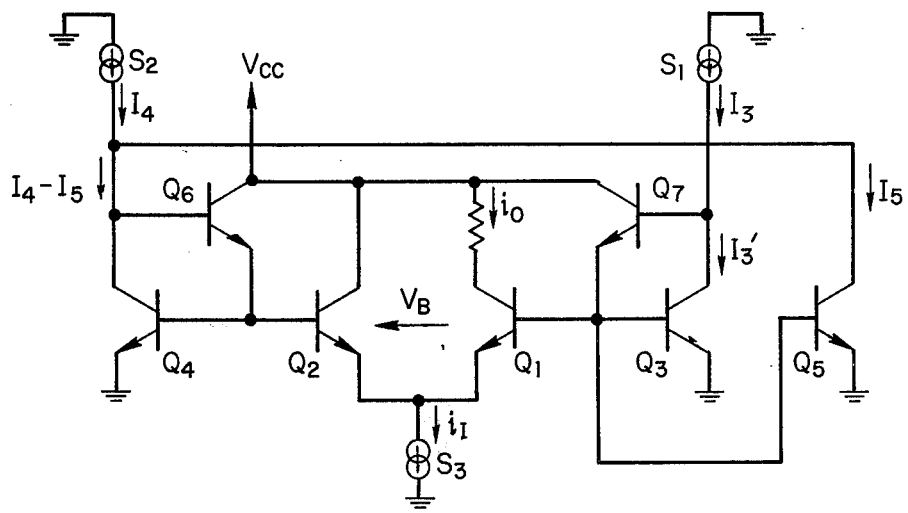
FIG. 3 is a schematic diagram of another embodiment of the present invention.

In the circuit shown in FIG. 3, feedback transistors $Q_6$ and $Q_7$ are added to the circuit configuration of FIG. 2. In this circuit, the interconnection between the base and collector of $Q_3$, as well as the same connection of $Q_4$, in the circuit of FIG. 2 is broken. The bases of $Q_3$ and $Q_4$ remain connected to the bases of $Q_1$ and $Q_2$, respectively, and the collectors of $Q_3$ and $Q_4$ remain connected to the gain control D.C. current sources $S_1$ and $S_2$, respectively. Feedback transistors $Q_6$ and $Q_7$ are connected across $Q_4$ and $Q_3$, respectively. The emitter of each feedback transistor $Q_6$ and $Q_7$ is connected to the corresponding base of $Q_4$ and $Q_3$, the base of each feedback transistor $Q_6$ and $Q_7$ is connected to the collector of the same corresponding transistor $Q_4$ and $Q_3$, and the collectors of feedback transistors $Q_6$ and $Q_7$ are both connected to the D.C. bias voltage source $V_{cc}$.

Feedback transistors $Q_6$ and $Q_7$ reduce the current drawn from gain control D.C. current sources $S_2$ and $S_1$ to drive the bases of $Q_2$ and $Q_4$, and $Q_1$, $Q_3$ and $Q_5$, respectively, by a factor of $h_{FE}$ (i.e., the D.C. current gain of a transistor defined as a ratio of the D.C. collector current to the D.C. base current) for the corresponding feedback transistor. By minimizing the currents drawn from gain control D.C. current sources $S_1$ and $S_2$ for base drive currents, transistor $Q_3$ collector current $I'_3$ will be more nearly equal to gain control D.C. current $I_3$ resulting in an improved equality of the currents $I_5$ and $I_3$. Also, the current gain $A_I$ will be more nearly equal to the simple ratio of the gain control D.C. currents $I_3$ and $I_4$.

The circuit configurations shown in FIGS. 2 and 3 are each fully integrable onto a single semiconductor chip. Such an implementation of these circuits provides a close match of any two transistors in the circuit which have substantially the same emitter surface area. Varying the ratio of the emitter surface area occupied by any two transistors results in the scaling of the collector currents of those two transistors for the same bias conditions. For example, if the emitter surface area of transistor $Q_5$ is some fraction, less than unity, $n$, of the emitter surface area of transistor $Q_3$, current $I_5$ will be equivalent to $nI_3$ and the current gain of the amplifier will be $$A_I = \frac{I_3}{I_4 - (n-1)I_3} \quad (6)$$

Many applications of differentially connected pair amplifiers are for automatic gain control (AGC) amplifiers where the output signal is to be kept constant for all levels of the input signal. The AGC cell of the prior art shown in FIG. 4a experiences errors in the output signal as a result of the base resistance of the transistors $Q_1$ and $Q_2$, and the widely varying output modulation index where modulation index is defined as ratio of the A.C. signal current to the D.C. bias current. The variations of the output modulation index are the result of the same variations in the input modulation index and the equality of the two modulation indices.

Figure 4:
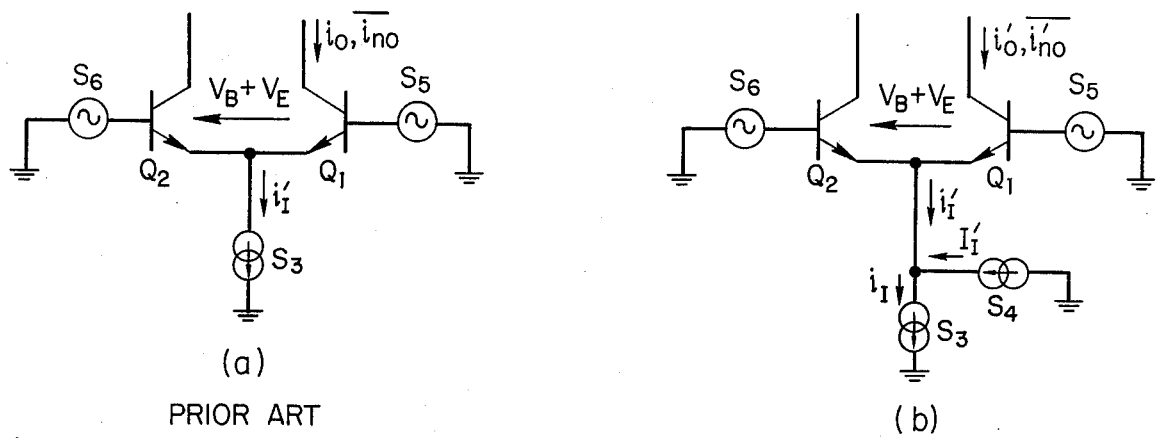
FIGS. 4a and 4b schematically illustrate the basic differentially connected pair noise current and the preferred optimization method of the present invention.

In reference to FIG. 4a, a differentially connected pair of transistors $Q_1$ and $Q_2$ is shown with the control voltage, $V_B$, plus an error voltage, $V_E$, between the bases of the two transistors $Q_1$ and $Q_2$. An input current sink $S_3$ is shown connected to the differentially connected emitters of transistors $Q_1$ and $Q_2$, and input noise voltage sources $S_5$ and $S_6$ are shown connected to the bases of transistors $Q_1$ and $Q_2$. The output r.m.s. voltages of the uncorrelated noise voltage sources $S_5$ and $S_6$ are substantially the same since transistors $Q_1$ and $Q_2$ are matched. Also, the output current, $i_0$, and the r.m.s. value of the output noise current, $\bar{i}_{no}$, are shown as $Q_1$ collector currents.

Each of the currents $i_0$ and $i_I$ represents the summation of a D.C. and an A.C. current component, for example, $$i_I = I_I + i_i \tag{7}$$

where $I_I$ is the D.C. component and $i_i$ is the A.C. signal component. The r.m.s. value of the output noise current for this circuit is $$\bar{i}_{no} = \sqrt{2}\, \bar{e}_n\, A_I(1 - A_I)(q/kT)\, I_I \tag{8}$$

where $\bar{e}_n$ is the r.m.s. value of the input noise voltages from sources $S_5$ and $S_6$, and the input and output modulation indices are $$\eta_I = \eta_o = \frac{i_i}{I_I} \tag{9}$$

From equation 8, it can be seen that the r.m.s. value of the output noise current, $\bar{i}_{no}$, is directly proportional to the input D.C. current, $I_I$. Also from equation 8, it can be seen that the minimum value of the r.m.s. value of the output noise current, $\bar{i}_{no}$, occurs when the current gain, $A_I$, approaches 1 or 0, and the maximum value of $\bar{i}_{no}$ occurs for a current gain, $A_I$, of 0.5. Since the output signal current, $i_0$, is kept constant in AGC amplifiers, the input signal current, $i_i$, is a maximum at $A_I = A_{I\,min}$ since $i_i = i_0/A_I$. Further, the larger the input signal current, $i_i$, the larger the input D.C. current, $I_I$, necessary to maintain the input modulation index in approximately the same range to prevent clipping of the input signal current.

The circuit configuration of FIG. 4b is identical to that of FIG. 4a with the addition of a D.C. bias current source $S_4$ connected in parallel with current sink $S_3$. The differentially connected pair input current, $i'_I$, for this circuit configuration is $$i'_I = i_I - I'_I \tag{10}$$

where $i_I = i_i + I_{I\,max}$, $I'_I$ is supplied by current source $S_4$, and $I_{I\,max}$ is the value of the input D.C. current for $A_I = A_{I\,min}$ of the prior art circuit of FIG. 4a. Thus, if $$I'_I = I_{I\,max}\left(1 - \frac{A_{I\,min}}{A_I}\right), \text{ then} \tag{11}$$

$$i'_I = i_i + I_{I\,max}\frac{A_{I\,min}}{A_I}$$

and the output current, $i'_0$, becomes $$i'_0 = A_I i_i + I_{I\,max} A_{I\,min} \tag{12}$$

The r.m.s. value of the output noise current, $\bar{i'}_{no}$, for this circuit is $$\bar{i'}_{no} = \sqrt{2}\, \bar{e}_n\, A_I (1 - A_I) \frac{q}{kT} I_{I\,max} \frac{A_{I\,min}}{A_I} \tag{13}$$

with an output modulation index of $$\eta'_o = \frac{A_I i_i}{A_{I\,min} I_{I\,max}} = \frac{i_o}{I_O} \tag{14}$$

Thus, this circuit configuration with the input current $I'_I$ varying in proportion to the input signal current maintains the input modulation index constant which results in the output modulation index $\eta'_o$ remaining constant if the product of the current gain, $A_I$, and the input signal current, $i_i$, remains constant. This further implies that the D.C. component of the output current, $I_0$, also remains constant since the value of the minimum current gain, $A_{I\,min}$, is a constant, and the r.m.s. value of the output noise current is no greater than the corresponding r.m.s value of the output noise current of the uncompensated circuit for a gain of $A_{I\,min}$.

Therefore, if the input current sink $S_3$ shown in FIGS. 2 and 3 is replaced with the dual current source and sink $S_3$ and $S_4$ shown in FIG. 4b, the resultant circuit becomes a broad band differential amplifier with a current gain which is variable linearly or hyperbolically by varying one of two gain control D.C. currents with a minimum of noise on the output signal.

Figure 5:
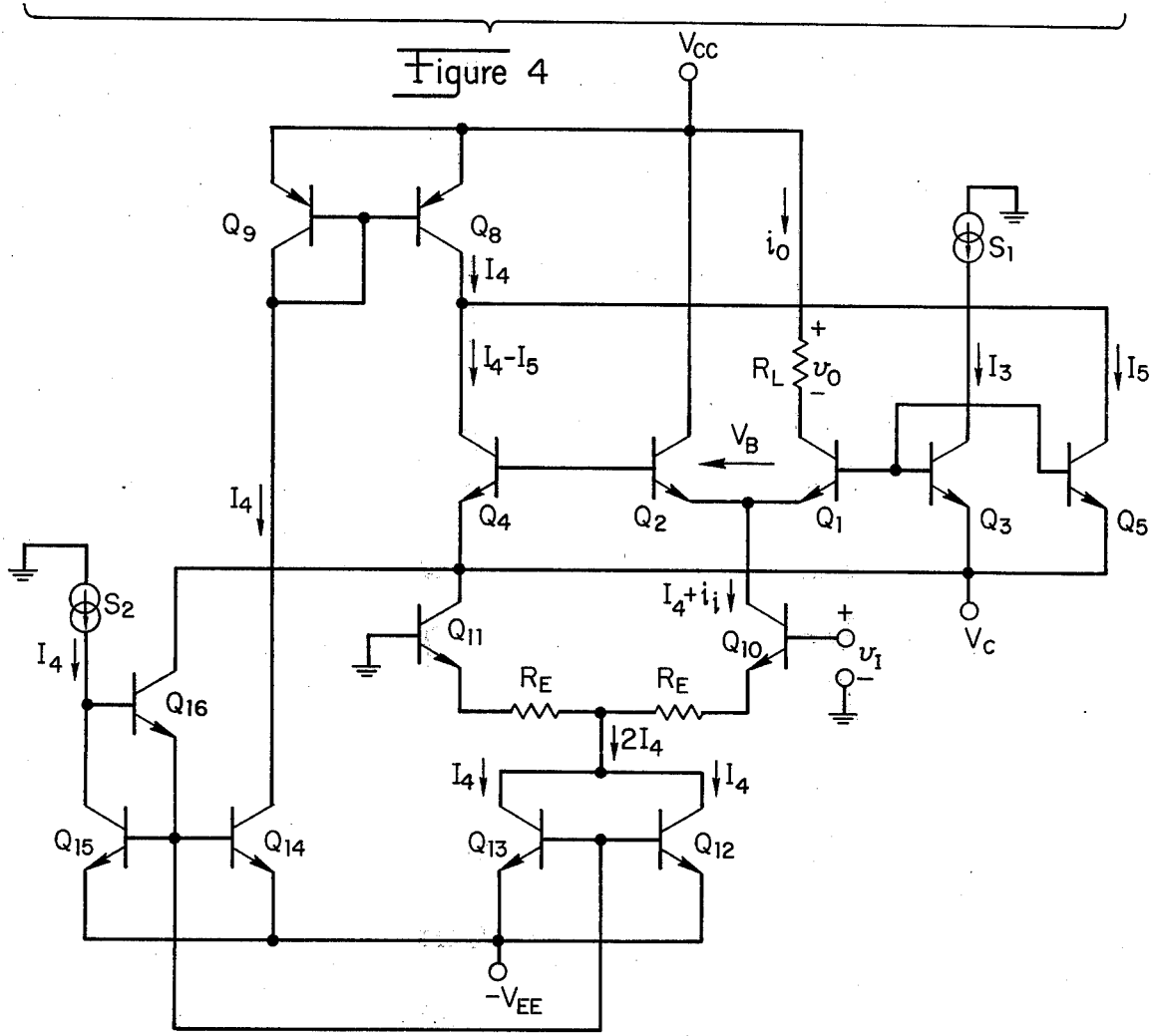
FIG. 5 is a schematic diagram of another embodiment of the present invention that includes composite input current to minimize output signal noise.

FIG. 5 shows the broad band amplifier circuit of FIG. 2 in which the input current source, $i_I$, has been replaced by a composite input current source as in FIG. 4b to minimize the output noise. The circuit arrangement for connecting gain control D.C. current source $S_2$ to the amplifier has also been modified to supply current $I_4$ and to supply the circuitry to generate $I'_I$ from the same current source. To achieve the desired result, it is desirable that all of the transistors in the circuit of FIG. 5 be matched.

The basic amplifier circuit of transistors $Q_1$ through $Q_5$ is as shown in FIG. 2 with the circuit referenced to a return bias voltage $V_C$ instead of ground. The gain control D.C. current source $S_2$ is connected to the collector of a common emitter transistor $Q_{15}$ with the emitter connected to a negative bias voltage source, $-V_{EE}$. The base and emitter of transistor $Q_{16}$ are connected to the collector and base, respectively, of transistor $Q_{15}$. The collector of transistor $Q_{16}$ is connected to the same reference voltage source, $V_C$, as are transistors $Q_3$, $Q_4$ and $Q_5$. Transistor $Q_{16}$ reduces the current drain on gain control D.C. current source $S_2$ by transistors $Q_{12}$, $Q_{13}$, $Q_{14}$ and $Q_{15}$ to make the collector current of $Q_{15}$ more nearly equal to $I_4$.

Transistors $Q_8$, $Q_9$ and $Q_{14}$ are included to provide a current equivalent to $I_4$ from the positive bias voltage source $V_{cc}$ to the basic amplifier. The emitters of PNP transistors $Q_8$ and $Q_9$ are connected to the positive bias voltage, $V_{cc}$, with the collector of transistor $Q_8$ connected to the collectors of transistors $Q_4$ and $Q_5$ to provide a D.C. bias current thereto. Transistor $Q_9$ has an interconnection between its base and collector to function as a diode, with this base-collector interconnection connected to the base of transistor $Q_8$ and the collector of transistor $Q_{14}$. The base and emitter of transistor $Q_{14}$ are connected to the base and emitter, respectively, of transistor $Q_{15}$, so that the collector current of transistor $Q_{14}$ mirrors the collector current of transistor $Q_{15}$ and is approximately equal to $I_4$. Since the collector current of transistor $Q_{14}$ is approximately $I_4$, so are the collector currents of $Q_9$ and $Q_8$ since the collector current of transistor $Q_9$ is mirrored to the collector of transistor $Q_8$ as a result of the interconnection and matching between these transistors.

The composite input current is produced by the portion of the illustrated circuit including transistors $Q_{10}$ through $Q_{13}$. Transistors $Q_{12}$ and $Q_{13}$ are connected in parallel with the emitters connected to the negative bias voltage source, $-V_{EE}$, the collectors connected together and the bases connected to the base of transistor $Q_{15}$ so that the collector currents of transistors $Q_{12}$ and $Q_{13}$ mirror $I_4$, the collector current of transistor $Q_{15}$, and both are approximately equivalent to $I_4$. The interconnected collectors of transistors $Q_{12}$ and $Q_{13}$ are connected to the emitters of transistors $Q_{10}$ and $Q_{11}$ through two emitter resistors of equal resistance, $R_E$. The base of transistor $Q_{11}$ is grounded and the collector is connected to the return bias voltage $V_C$. Transistor $Q_{10}$ is a voltage-to-current converter wherein the input voltage, $V_I$, applied to the base creates the input signal current, $i_I$. As a result of the interconnection between transistors $Q_{10}$ through $Q_{13}$, a D.C. current that satisfies the $i'_I$ relationship of equation 11 is realized with the resulting collector current of $Q_{10}$ being $i_i + I_4$. The collector of transistor $Q_{10}$ is connected to the differentially connected emitters of transistors $Q_1$ and $Q_2$ to supply the input signal to the basic amplifier. In addition, the voltage gain of the circuit shown in FIG. 5 can be represented as $$A_V = \frac{v_o}{V_I} = \frac{R_L I_3}{2 R_E I_4} \quad (15)$$

I claim:

1. A broad band variable gain amplifier comprising:
a first and a second transistor, each having an emitter, a collector and a base, said first and second transistors are connected differentially with the emitters of each of the transistors connected together with the amplifier output signal being selected as the collector current of the second transistor;
input current means coupled to the emitters of the first and second transistors for applying an input current thereto;
control voltage application means connected to the bases of the first and second transistors for applying a control voltage between the bases of these transistors to control the gain of the first and second transistors;
means for receiving a first and a second D.C. current, each current being coupled to the control voltage application means, for biasing and controlling the gain of the first and second transistors; and
current subtracting means coupled to the means for receiving said first D.C. current and to said control voltage application means for subtracting a current that is equivalent to a fractional part of said second D.C. current from said first D.C. current to form a resultant bias current;
said control voltage being the voltage differential between the two bases of the first and second transistors, with the voltage on the base of the second transistor being responsive to said second D.C. current and the voltage on the base of the first transistor being responsive to the resultant bias current.

2. A broad band variable gain amplifier as in claim 1 wherein:
the control voltage application means comprises a third and fourth transistor, each having an emitter, a collector and a base, and each of said third and fourth transistors being connected in a common emitter configuration and each having its base connected to its collector, said base-collector interconnection of the third transistor being connected to the means for receiving said second D.C. current and to the base of the second transistor to apply a voltage thereto that is responsive to the second D.C. current, and the base-collector interconnection of the fourth transistor being connected to receive the resultant bias current and to the base of the first transistor to apply thereto a voltage responsive to the resultant bias current; and
the current subtracting means comprises a fifth transistor having an emitter, a collector and a base, with its emitter and base connected to the emitter and base, respectively, of the third transistor, and its collector connected to the means for receiving said first D.C. current for subtracting the collector current of the fifth transistor from the first D.C. current, said collector current of the fifth transistor being equal to at least a fraction of the collector current of the third transistor, said current fraction being a function of the match between the fifth transistor and the third transistor.

3. A broad band variable gain amplifier as in claim 1 wherein the control voltage application means comprises:
a third and fourth transistor, each having an emitter, a collector and a base, and each of said third and fourth transistors being connected in a common emitter configuration with the third transistor having its collector connected to the means for receiving said second D.C. current and its base connected to the base of the second transistor to apply a voltage responsive to the second D.C. current thereto, and the fourth transistor having its collector connected to receive said resultant bias current and its base connected to the base of the first transistor to apply a voltage responsive to the resultant bias current thereto;
means for receiving a bias voltage; and
a fifth and a sixth transistors, each having an emitter, a collector and a base, said fifth transistor having its emitter and base connected to the base and collector of the third transistor, respectively, the sixth transistor having its emitter and base connected to the base and collector of the fourth transistor, respectively, the collectors of both the fifth and sixth transistors connected to the means for receiving said bias voltage.

4. A broad band variable gain amplifier as in claim 3 wherein said fifth and sixth transistors reduce the current drain from the means for receiving said first and second D.C. currents by the bases of the third and fourth transistors and the first and second transistors by a factor of $h_{FE}$ of the corresponding fifth or sixth transistor.

5. A broad band variable gain amplifier as in claim 3 wherein the current subtracting means comprises a seventh transistor having an emitter, a collector and a base with the emitter and base connected to the emitter and base, respectively, of the third transistor, and its collector connected to the means for receiving said first D.C. current for subtracting the collector current of the seventh transistor from the first D.C. current, said collector current of the seventh transistor being equal to at least a fraction of the collector current of the third transistor, said current fraction being a function of the match between the seventh transistor and the third transistor.

6. A broad band variable gain amplifier as in claim 1 wherein the current gain, $A_I$, of the amplifier is represented by the formula $$A_I = \frac{I_3}{I_4 - (n-1)I_3},$$

where $I_4$ represents the value of the first D.C. current, $I_3$ represents the value of the second D.C. current, $I_4 \geq I_3$, $0 \leq n \leq 1$, and $0 \leq A_1 \leq 1$, wherein the amplifier current gain for a factor of $n$ equal to unity is hyperbolically variable by holding the second D.C. current constant while varying the first D.C. current and is linearly variable by holding the first D.C. current constant while varying the second D.C. current.

7. A broad band variable gain amplifier comprising:
a first and a second transistor, each having an emitter, a collector and a base, said first and second transistors are connected differentially with the emitters of each of these transistors connected together with the collector current of the second transistor selected as the output signal;
gain control means connected to the bases of the first and second transistors for controlling the gain of the first and second transistors, said gain control means including:
control voltage application means connected to the bases of the first and second transistors for controlling the gain thereof, said control voltage being the voltage differential between the two bases of the first and second transistors; and
means for receiving a first and a second D.C. current, each current being coupled to the control voltage application means for biasing and controlling the gain of the first and second transistors; and input current means coupled to the differentially connected emitters of the first and second transistors for applying an input current, thereto, said input current means including:
means for applying a first input current to the differentially connected emitters of the first and second transistors with a D.C. and an A.C. current component being represented by the formula $$i_I = I_{I_{MAX}} + i_i,$$

where $i_i$ represents the A.C. current component and $I_{I_{MAX}}$ represents a constant D.C. current component; and
means for applying a second input current to the differentially connected emitters of the first and second transistors for subtracting a variable D.C. current responsive to the ratio of the first and the second D.C. currents from the first input current, the variable D.C. current, $I'_I$, being represented by the formula $$I'_I = I_{I_{MAX}} \frac{A_{I_{min}}}{A_I} = I_{I_{MAX}} \frac{I_4}{I_3} A_{I_{min}},$$

where $A_I$ represents the amplifier current gain, $A_{I_{min}}$ represents the minimum amplifier current gain, $I_4$ represents the value of the first D.C. current, $I_3$ represents the value of the second D.C. current, and the resultant composite input current, $i'_I$, to the differentially connected emitters of the first and second transistors being represented by the formula $$i'_I = i_i + I_{I_{MAX}} \frac{A_{I_{min}}}{A_I},$$

said resultant composite input current reducing the output noise current contributed by said first and second transistors and the variation of the output current as a function of the input current variations.

8. A broad band variable gain amplifier as in claim 7 wherein:
said amplifier further comprises:
means for receiving a first voltage;
means for receiving a second voltage;
means for receiving a third voltage; and
means for receiving a fourth voltage;
the means for applying the first input current comprises:
means for receiving an input signal voltage; and
a third transistor having an emitter, a collector and a base, the collector of the third transistor is connector to the emitters of the first and second transistors and its base is connected to the means for receiving the input signal voltage for creating an input signal current to the first and second transistors that is responsive to the input signal voltage;
the means for applying the second input current comprises:
a fourth and a fifth transistor, each having an emitter, a collector and a base, and each being connected in a common emitter configuration with the base, collector and emitter leads of the fourth transistor connected to the base, collector and emitter, respectively, of the fifth transistor, the connected bases being coupled to the means for receiving the first D.C. current to mirror that current as the collector current of each of the fourth and fifth transistors;
a sixth transistor having an emitter, a collector and a base, with the base connected to the means for receiving said fourth voltage and the collector connected to the means for receiving said second voltage; and
a pair of resistors of equal value with one end of both resistors connected to the collectors of the fourth and fifth transistors, the other end of one of the resistors connected to the emitter of the sixth transistor, and the other end of the second resistor connected to the emitter of the third transistor; and
the means for receiving the first D.C. current comprises:
a seventh transistor having an emitter, a collector and a base, connected in the common emitter configuration with its emitter connected to the means for receiving said third voltage, its emitter and base connected to the emitters and bases of the fourth and fifth transistor, respectively, and its collector connected to receive the first D.C. current;

an eighth transistor having an emitter, a collector and a base, connected in the common emitter configuration with its emitter and its base connected to the emitter and base, respectively, of the seventh transistor for mirroring the collector current of the seventh transistor as the collector current of the eighth transistor;

a ninth transistor having an emitter, a collector and a base, connected across the seventh transistor with its base and emitter connected to the collector and base, respectively, of the seventh transistor and its collector connected to the means for receiving said second voltage for minimizing the current drain on the first D.C. current to supply the base drive currents of the fourth, fifth, seventh, and eighth transistors;

a tenth transistor having an emitter, a collector and a base, with its base and collector interconnected to cause the tenth transistor to function as a diode, its collector is also connected to the collector of the eighth transistor and its emitter is connected to the means for receiving said first voltage; and an eleventh transistor having an emitter, a collector and a base, with its base and emitter connected to the base and emitter, respectively, of the tenth transistor and its collector connected to the control voltage application means for supplying a current substantially equal to the first D.C. current.

* * * * *

UNITED STATES PATENT AND TRADEMARK OFFICE
CERTIFICATE OF CORRECTION

PATENT NO. : 4,017,804
DATED : April 12, 1977
INVENTOR(S) : Dan M. Hunsinger

It is certified that error appears in the above-identified patent and that said Letters Patent are hereby corrected as shown below:

Column 7, line 16, "$V_I$" should read -- $v_I$ --.

Signed and Sealed this

*fifth* Day of *July 1977*

[SEAL]

Attest:

RUTH C. MASON
*Attesting Officer*

C. MARSHALL DANN
*Commissioner of Patents and Trademarks*